United States Patent
Kim et al.

(10) Patent No.: US 8,304,987 B2
(45) Date of Patent: Nov. 6, 2012

(54) ORGANIC LIGHT EMITTING DISPLAY APPARATUS INCLUDING A LINE CONNECTING BRIDGE AND METHOD OF MANUFACTURING THE SAME

(75) Inventors: Min-Kyu Kim, Yongin (KR); Seong-Kweon Heo, Yongin (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 38 days.

(21) Appl. No.: 12/926,005

(22) Filed: Oct. 20, 2010

(65) Prior Publication Data

US 2011/0163329 A1 Jul. 7, 2011

(30) Foreign Application Priority Data

Jan. 6, 2010 (KR) .................. 10-2010-0000898

(51) Int. Cl.
*H01L 51/50* (2006.01)
*H01L 33/08* (2010.01)

(52) U.S. Cl. ........ 313/505; 313/504; 313/506; 313/507; 445/24; 315/169.3

(58) Field of Classification Search ............... 315/169.3; 313/501–512; 257/40
See application file for complete search history.

(56) References Cited

U.S. PATENT DOCUMENTS

| 2001/0009280 | A1 | 7/2001 | Tanaka et al. | |
|---|---|---|---|---|
| 2005/0140307 | A1 | 6/2005 | Park | |
| 2006/0125381 | A1 | 6/2006 | Oh | |
| 2006/0279499 | A1* | 12/2006 | Park et al. | 345/92 |
| 2007/0194699 | A1* | 8/2007 | Lee et al. | 313/505 |
| 2009/0250690 | A1* | 10/2009 | Shin et al. | 257/40 |

FOREIGN PATENT DOCUMENTS

| JP | 2001-203080 A | 7/2001 |
|---|---|---|
| KR | 10 2003-0055504 A | 7/2003 |
| KR | 10 2005-0068795 A | 7/2005 |
| KR | 10 2006-0067050 A | 6/2006 |
| KR | 10 2006-0067057 A | 6/2006 |

OTHER PUBLICATIONS

Korean Office Notice of Allowance in KR 10-2010-0000898, dated Oct. 27, 2011 (Kim, et al.).

* cited by examiner

*Primary Examiner* — Tracie Y Green
(74) *Attorney, Agent, or Firm* — Lee & Morse, P.C.

(57) ABSTRACT

An organic light emitting display apparatus and a method of fabricating the same are provided. The organic light emitting display apparatus includes a pixel unit on which an organic light emitting device is formed, a thin film transistor (TFT) electrically connected to the pixel unit and a data line and a scan line electrically connected to the TFT and disposed crossing each other on a substrate. The data line and the scan line are formed in one layer. A bridge that allows one of the data line and the scan line to bypass the other is on an intersection of the data line and the scan line.

20 Claims, 5 Drawing Sheets

ORGANIC LIGHT EMITTING DISPLAY APPARATUS INCLUDING A LINE CONNECTING BRIDGE AND METHOD OF MANUFACTURING THE SAME

BACKGROUND

1. Field

One or more embodiments of the present invention relate to an organic light emitting display apparatus and a method of fabricating the same, and more particularly, to an organic light emitting display apparatus having an improved stack structure so as to reduce the number of mask used and a method of fabricating the organic light emitting display apparatus.

2. Description of the Related Art

Recently, flat panel display apparatuses, which may be portable, are widely used as display apparatuses. Among flat panel display apparatuses, electroluminescence display apparatuses are self-emission type display apparatuses, which have a wide viewing angle, excellent contrast, and a fast response speed, and thus, are considered as next generation display apparatuses. In addition, organic light emitting display apparatuses, in which a light emitting layer is formed of an organic material, have higher brightness, superior driving voltages, and faster response speeds than those of inorganic light emitting display apparatuses, and may realize multiple colors.

Organic light emitting display apparatuses include a thin film transistor (TFT) unit and an organic light emitting device driven by the TFT unit to emit light. The TFT unit may be formed by stacking a conductor, a semiconductor, and an insulating layer on a substrate, and forming a TFT including a driving transistor and a switching transistor, a capacitor, data lines, scan lines, and pixel units for controlling the organic light emitting device. The TFT unit may be fabricated by a photoresist process by using a mask.

However, since the data lines and the scan lines cross each other on the substrate, it is difficult to dispose the data lines and the scan lines in the same layer. Therefore, the data lines and the scan lines are disposed in different layers, separated by the insulating layer, according to the conventional art. However, when the number of stacked layers increases, processes of exposing patterns by using a mask and etching are additionally performed. Therefore, fabrication processes become complex as the number of stacks increases.

Recently, a half-tone mask has been used to reduce the number of masks used; however, exposure degrees vary depending on portions exposed when using a mask once. Therefore, it is very difficult to perform the process described above, and thus, defective rate of products is increased.

In addition, since the substrate has increased in sized in order to realize a large screen, low resistance wires are necessary, and thus, the data lines and scan lines are formed to be thick. However, the insulating layer disposed between the data lines and the scan lines, which are disposed in different layers, should be thicker than the data lines and the scan lines in order to prevent an electric short from generating where the data lines and the scan lines intersect.

SUMMARY

Embodiments are therefore directed to organic light emitting display apparatus and a method of fabricating the same, which substantially overcome one or more of the problems due to the limitations and disadvantages of the related art.

It is therefore a feature of an embodiment to provide an organic light emitting display apparatus having an improved stack structure so as to simplify processes of fabricating the apparatus by reducing the number of masks used, and a method of fabricating the organic light emitting display apparatus.

It is another feature of an embodiment to provide an organic light emitting display apparatus having an improved stack structure so as to simplify processes of fabricating the apparatus by reducing the number of masks without using half-tone masks, and a method of fabricating the organic light emitting display apparatus.

It is yet another feature of an embodiment to provide an organic light emitting display apparatus having an improved stack structure so as to realize low resistance wires, and a method of fabricating the organic light emitting display apparatus.

Additional aspects will be set forth in part in the description which follows and, in part, will be apparent from the description, or may be learned by practice of the presented embodiments.

At least one of the above and additional features and advantages may be realized by providing an organic light emitting display apparatus including a pixel unit on which an organic light emitting device is formed, a thin film transistor (TFT) electrically connected to the pixel unit, a data line and a scan line electrically connected to the TFT and disposed crossing each other on a substrate, wherein the data line and the scan line are formed in one layer, and a bridge that allows one of the data line and the scan line to bypass the other is on an intersection of the data line and the scan line.

The bridge may include a bridge for the data line and a bridge for the scan line formed on the substrate. The intersection may further include an insulating layer on the bridge for the data line and the bridge for the scan line and contact holes in the insulating layer for connecting to the bridge for the data line and the bridge for the scan line. When the data line and the scan line are formed in one layer on the insulating layer, the data line is connected to the bridge for the data line via the contact holes and the scan line is connected to the bridge for the scan line via the contact holes so as to allow one of the data line and the scan line to cross each other while not interfering with each other.

The bridge for the data line may cross the scan line while the insulating layer is interposed therebetween, and the bridge for the scan line may cross a source-drain electrode layer of the TFT diverging from the data line while the insulating layer is interposed therebetween.

The TFT may include a gate electrode layer, on which the insulating layer is formed, formed in the same layer as the bridge for the data line and the bridge for the scan line, an active layer formed on the insulating layer, an etch-stop insulating layer formed on the active layer and a source-drain electrode formed on the etch-stop insulating layer in the same layer as the data line and the scan line.

The TFT may include a switching transistor electrically connected to the data line and the scan line and a driving transistor electrically connected to the data line and the pixel unit. The switching transistor may use the bridge for the scan line as a gate electrode layer.

The pixel unit may include a gate electrode layer, on which the insulating layer is formed, in the same layer as the bridge for the data line and the bridge for the scan line on the substrate, and a pixel electrode layer formed on the insulating layer and in the same layer as the data line and the scan line and connected to the gate electrode layer.

The organic light emitting display apparatus may further include a capacitor electrically connected between the TFT and the pixel unit. The capacitor may include a gate electrode layer, on which the insulating layer is formed, in the same layer as the bridge for the data line and the bridge for the scan line on the substrate, and a source-drain electrode layer formed on the insulating layer and in the same layer as the data line and the scan line.

At least one of the above and additional features and advantages may be realized by providing a method of fabricating an organic light emitting display apparatus, the method including forming a pixel unit on which an organic light emitting device is formed, forming a thin film transistor (TFT) electrically connected to the pixel unit, forming a data line and a scan line electrically connected to the TFT and disposed crossing each other on a substrate, and forming a bridge that allows one of the data line and the scan line to bypass the other on an intersection of the data line and the scan line.

Forming the bridge may include forming a bridge for the data line and a bridge for the scan line on the substrate.

The method may further include forming an insulating layer on the bridge for the data line and the bridge for the scan line, forming contact holes that respectively contact the bridge for the data line and the bridge for the scan line in the insulating layer, and stacking the data line and the scan line on the insulating layer such that the data line is connected to the bridge for the data line via the contact holes and the scan line is connected to the bridge for the scan line via the contact holes so that the data line and the scan line cross over and under each other.

The bridge for the data line may cross the scan line with the insulating layer interposed therebetween, and the bridge for the scan line may cross a source-drain electrode layer of the TFT diverging from the data line with the insulating layer interposed therebetween.

Forming the TFT may include forming a gate electrode on the substrate in a layer that that the bridge for the data line and the bridge for the scan line are formed in, forming the insulating layer on the gate electrode layer, forming an active layer on the insulating layer, forming an etch-stop insulating layer on the active layer, and forming a source-drain electrode layer on the etch-stop insulating layer in a layer that the data line and the scan line are formed in so as to be connected to the active layer.

Forming the TFT may include forming a switching transistor electrically connected to the data line and the scan line and forming a driving transistor electrically connected to the data line and the pixel unit, wherein the switching transistor uses the bridge for the scan line as a gate electrode layer.

Forming the pixel unit may include forming a gate electrode layer on the substrate to be the same layer as the bridge for the data line and the bridge for the scan line, forming the insulating layer on the gate electrode layer, and forming a pixel electrode layer on the insulating layer and in a layer that the data line and the scan line are formed in so as to be connected to the gate electrode layer.

The method may further include forming a capacitor that is electrically connected between the TFT and the pixel unit. Forming the capacitor may include forming a gate electrode layer on the substrate to be the same layer as the bridge for the data line and the bridge for the scan line, forming the insulating layer on the gate electrode layer, and forming a source-drain electrode layer on the insulating layer in a layer that the data line and the scan line are formed in so as to be connected to the gate electrode layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
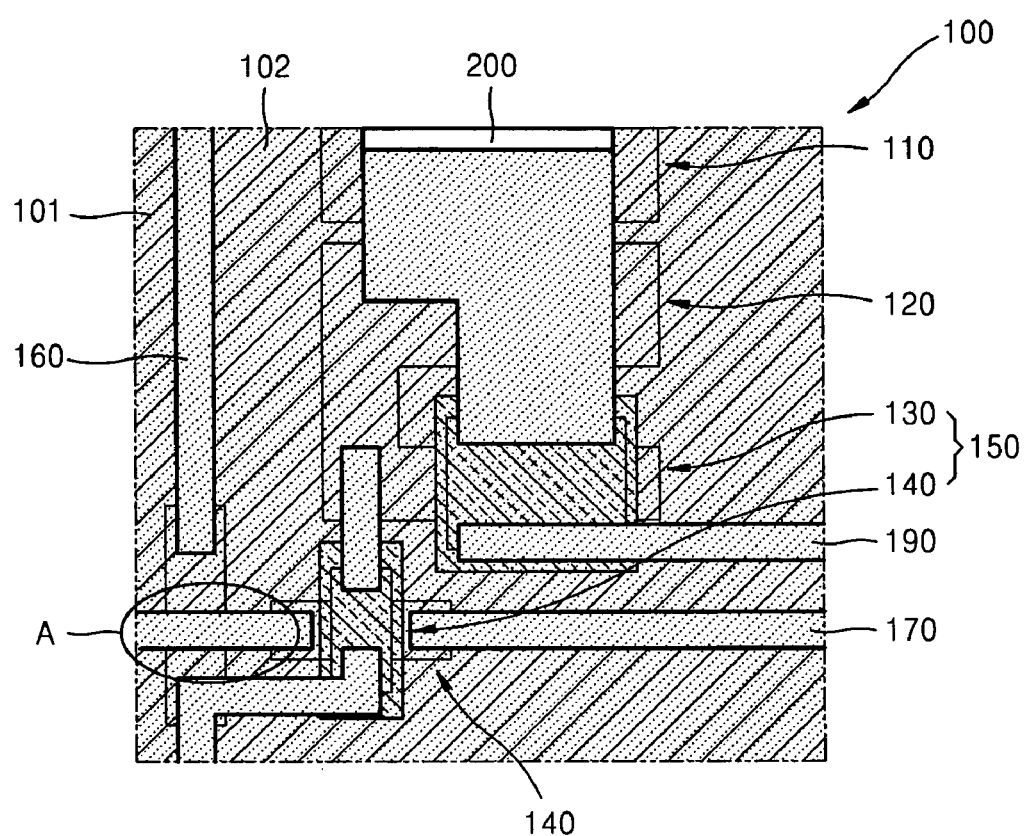
FIG. 1 illustrates a plan view of an organic light emitting display apparatus according to an embodiment of the present invention.

Korean Patent Application No. 10-2010-0000898, filed on Jan. 6, 2010, in the Korean Intellectual Property Office, and entitled: "Organic Light Emitting Display Apparatus and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of an organic light emitting display apparatus according to an embodiment of the present invention. FIGS. 2 through 5 illustrate cross-sectional views of a pixel unit 110, a thin film transistor (TFT) 150, a capacitor 120, and an intersection (part A) between a data line 160 and a scan line 170 in the organic light emitting display apparatus of the present embodiment.

Referring to FIG. 1, the organic light emitting display apparatus of the present embodiment includes a TFT unit 100 which includes the pixel unit 110, the TFT 150, the capacitor 120, the data line 160, the scan line 170, and a constant voltage line 190. The organic light emitting display apparatus also includes an organic light emitting device 200 electrically connected to the TFT unit 100 by being stacked on the pixel unit 110.

Figure 2:
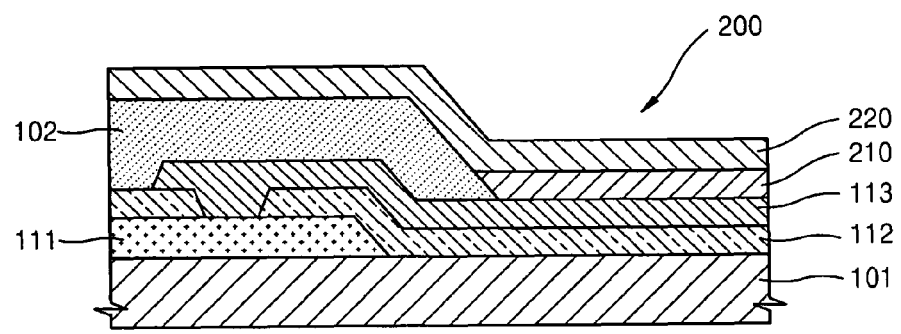
FIG. 2 illustrates a cross-sectional view of a pixel unit in the organic light emitting display apparatus shown in FIG. 1.

As shown in FIG. 2, the organic light emitting device 200 includes a pixel electrode layer 113 electrically connected to the TFT unit 100, a counter electrode layer 220 facing the pixel electrode layer 113, and an organic light emitting layer 210 disposed between the pixel electrode layer 113 and the counter electrode layer 220. Therefore, when a voltage is applied to the pixel electrode layer 113 from the TFT unit 100, the organic light emitting layer 210 between the pixel electrode layer 113 and the counter electrode layer 220 emits light. Here, the pixel electrode layer 113 is formed during stacking of the pixel unit 110 in the TFT unit 110, which will be described later.

The pixel unit 110, on which the organic light emitting device 200 is stacked, includes a gate electrode layer 111, an insulating layer 112, and the pixel electrode layer 113 each sequentially stacked on a substrate 101, as shown in FIG. 2. In addition, the gate electrode layer 111 and the pixel electrode layer 113 are connected to each other while penetrating through the insulating layer 112. Therefore, when an electric current flows on the gate electrode layer 111, the electric current also flows on the pixel electrode layer 113. Processes of stacking the layers described above will be described later. A pixel defining layer 102 defines boundaries between pixels.

Figure 3:
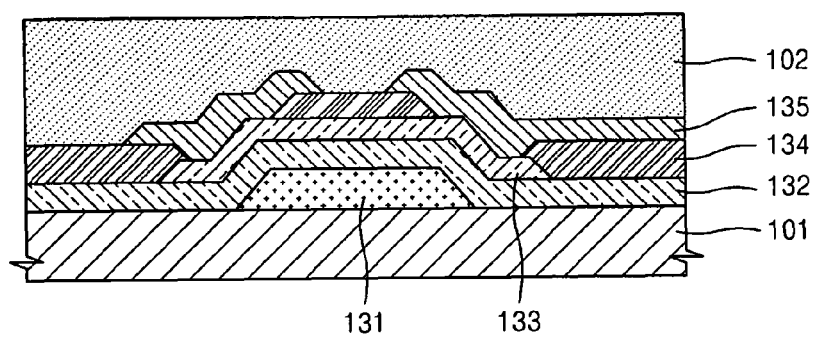
FIG. 3 illustrates a cross-sectional view of a driving transistor in the organic light emitting display apparatus shown in FIG. 1.

As noted above, the TFT 150 includes the switching transistor 140, electrically connected to the data line 160 and the scan line 170, and the driving transistor 130, electrically connected to the data line 160 and the pixel unit 110. A stacked structure of the switching transistor 140 and a stacked structure of driving transistor 130 are the same. FIG. 3 illustrates the structure of the driving transistor 130.

As shown in FIG. 3, the driving transistor 130 may include a gate electrode layer 131, an insulating layer 132, an active layer 133, an etch-stop insulating layer 134, and a source-drain electrode layer 135 each stacked sequentially on the substrate 101. Therefore, when an appropriate voltage is applied to the gate electrode layer 131, an electric current flows on the source-drain electrode layer 135 by using the active layer 133 as a channel. A source-drain electrode layer (145, refer to FIG. 6D) of the switching transistor 140 is connected to the gate electrode layer 131 of the driving transistor 130. The source-drain electrode layer 135 of the driving transistor 130 is connected to the gate electrode layer 111 of the pixel unit 110.

Therefore, when an appropriate voltage is applied to a gate electrode layer (not shown) of the switching transistor 140, an electric current flows between the driving transistor 130 and the pixel unit 110. The process of stacking the layers described above will be described later.

Figure 4:
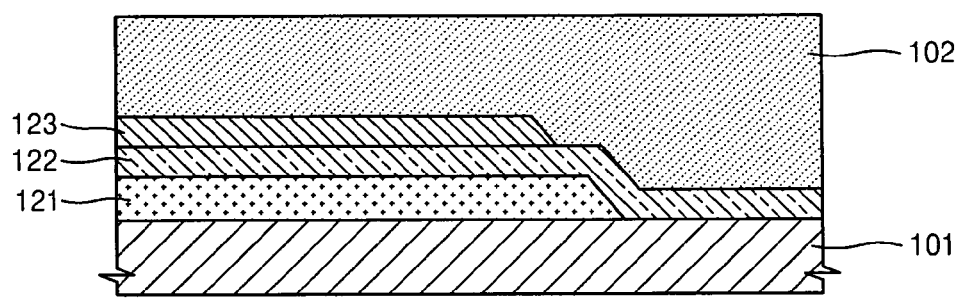
FIG. 4 illustrates a cross-sectional view of a capacitor in the organic light emitting display apparatus shown in FIG. 1.

The capacitor 120 performs charging/discharging operations between the driving transistor 130 and the pixel unit 110 in such a way that an image formed by light emitted from the organic light emitting device 200 may be displayed. FIG. 4 illustrates a cross-section of the capacitor 120, in which a gate electrode layer 121, an insulating layer 122, and a source-drain electrode layer 123 are sequentially stacked on the substrate 101.

Therefore, the conductive members of the capacitor 120, i.e., the gate electrode layer 121 and the source-drain electrode layer 123, face each other while having the insulating layer 122 interposed therebetween so as to form a general battery structure. Processes of stacking the above layers will be described later.

Figure 5:
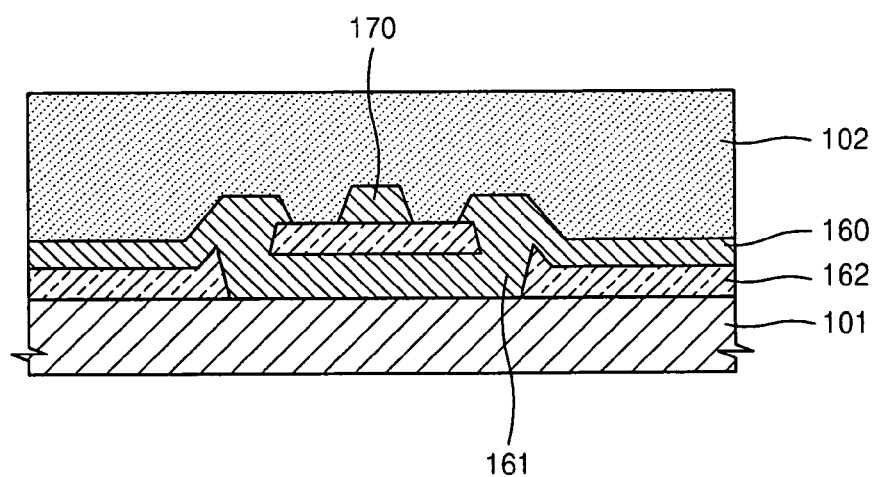
FIG. 5 illustrates a cross-sectional view of a part A on which a data line and a scan line cross each other in the organic light emitting display apparatus shown in FIG. 1.

FIG. 5 illustrates a cross-sectional view of the part A, i.e., a cross-sectional view of the intersection between the data line 160 and the scan line 170, shown in FIG. 1. As shown in FIG. 5, a bridge 161 for the data line 160, an insulating layer 162, and the data line 160 and the scan line 170 are stacked on the substrate 101.

Here, the bridge 161 for the data line 160 is formed in the same layer as the gate electrode layers 111, 121, and 131, and forms a bypass path that allows the data line 160 and the scan line 170 to respectively cross under and over each other without having interference between the wires. That is, the data line 160 and the scan line 170 are formed in the same layer, and then, respectively cross under and over each other via the bridge 161.

When the data line 160 and the scan line 170 are formed in the same layer, mask processes in fabricating the organic light emitting display apparatus, which will be described later, are simplified. That is, if the data line 160 and the scan line 170 are formed in separate layers, like in the conventional art, a mask process is performed during patterning of one of the data line 160 and the scan line 170, the insulating layer 162 is stacked on the line patterned, and then, another mask process is performed during patterning of the other line.

However, as described above, when the data line 160 and the scan line 170 are patterned simultaneously, the number of mask processes may be reduced, and thus the fabrication processes may be simplified.

Processes of fabricating the organic light emitting display apparatus having the structure described will be described as follows with reference to FIGS. 6A through 6D.

Figure 6A:
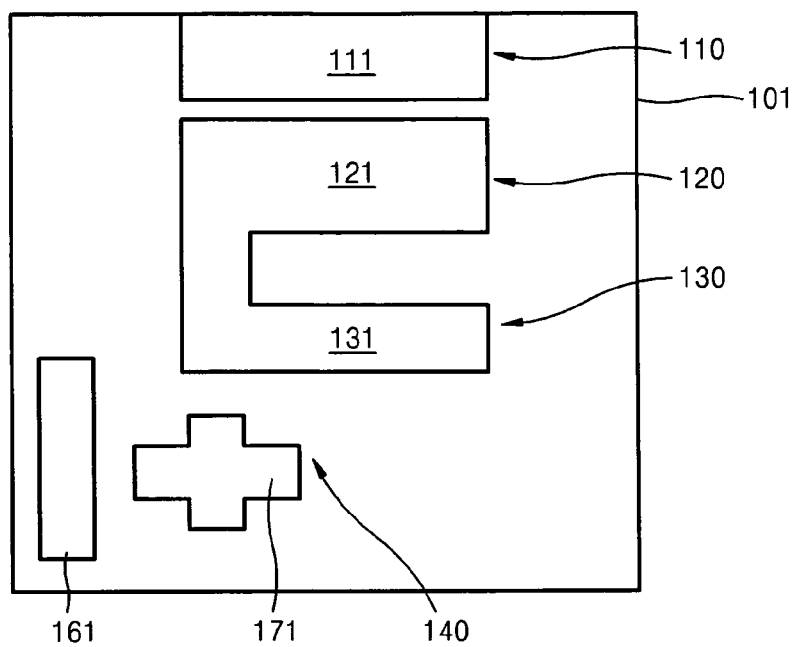
FIGS. 6A through 6D illustrates plan views of stages in a processes of manufacturing the organic light emitting display apparatus shown in FIG. 1, according to an embodiment of the present invention.

Referring to FIG. 6A, the gate electrode layers 111, 121, and 131 respectively of the pixel unit 110, the capacitor 120, the driving transistor 130, and the switching transistor 140, the bridge 161 for the data line 160, and a bridge 171 for the scan line 170 may be deposited on the substrate 101. That is, the gate electrode layers 111, 121, and 131 and the bridges 161 and 171 are formed of the same material and form first layers of the structure of the organic light emitting display apparatus described above.

The gate electrode layer of the switching transistor 140 may serve as the bridge 171 for the scan line 170. A first mask is used to pattern the gate electrode layers 111, 121, and 131 and the bridges 161 and 171.

The substrate 101 may be formed of a glass material, a plastic material such as acryl, or a metal material. In addition, a buffer layer (not shown) may be formed on the substrate 101 in order to more flatten the substrate.

Each of the gate electrode layers 111, 121, and 131 and the bridges 161 and 171 may be formed of a conductive material, e.g., molybdenum or indium tin oxide (ITO), and each may be formed as a double-layered structure including molybdenum stacked on ITO.

Figure 6B:
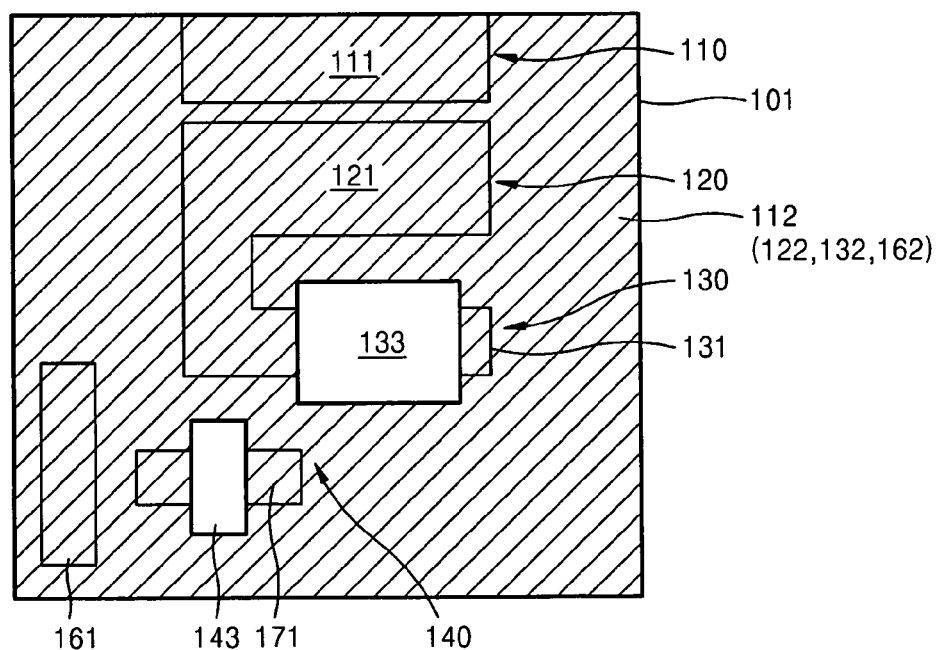

After the first layers have been formed, the insulating layers 112, 122, 132, and 162 are formed on the first layers. Then, as illustrated in FIG. 6B, the active layer 133 and an active layer 143 are respectively formed on the driving transistor 130 and the switching transistor 140. The active layers 133 and 143 may serve as conductive channels of the source-drain layers 135 and 145 (refer to FIG. 6C), which will be respectively stacked thereon.

The insulating layers 112, 122, 132, and 162 may be formed simultaneously as a single layer formed over all of the substrate 101. The insulating layers 112, 122, 132, and 162 may be formed of, e.g., silicon oxide, tantalum silicon oxide, or aluminum oxide.

The active layers 133 and 143 may be formed of, e.g., an oxide semiconductor. A second mask may be used to pattern the active layers 133 and 143.

Figure 6C:
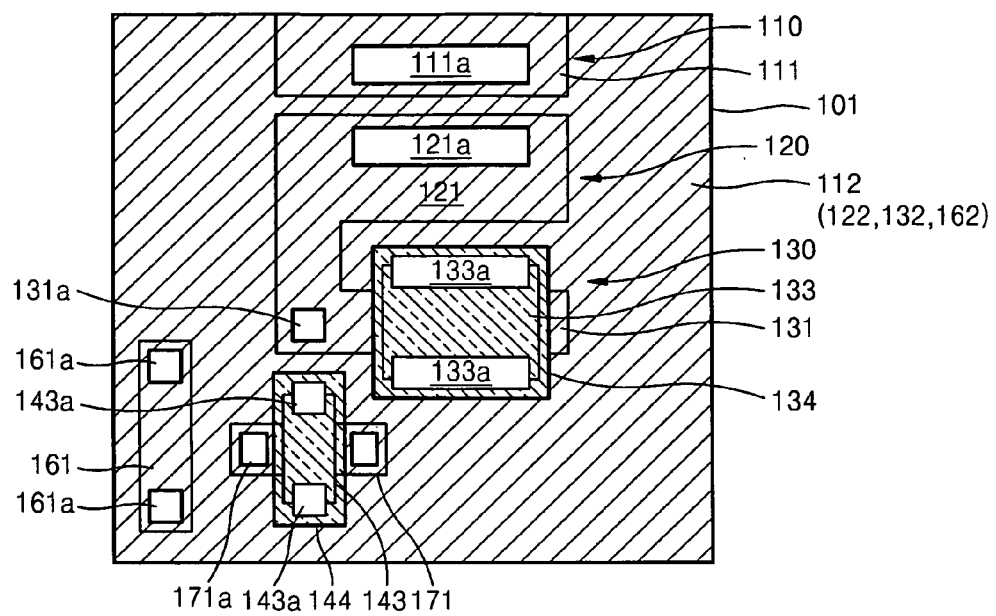

The etch-stop insulating layer 134 and an etch-stop insulating layer 144 may be formed. Then, as shown in FIG. 6C, contact holes 111a, 121a, 131a, 133a, 143a, 161a, and 171a may be formed in the insulating layers 112, 122, 132, and 162 and the etch-stop insulating layers 134 and 144, e.g., by a dry-etching method.

In the process described above, the etch-stop insulating layers 133 and 143 may only remain on the active layers 133 and 143 of the driving transistor 130 and the switching transistor 140. The etch-stop layers 133 and 134 may be formed of the same material as the insulating layers 112, 122, 132, and 162. A third mask may be used to form the contact holes 111a, 121a, 131a, 133a, 143a, 161a, and 171a.

Figure 6D:
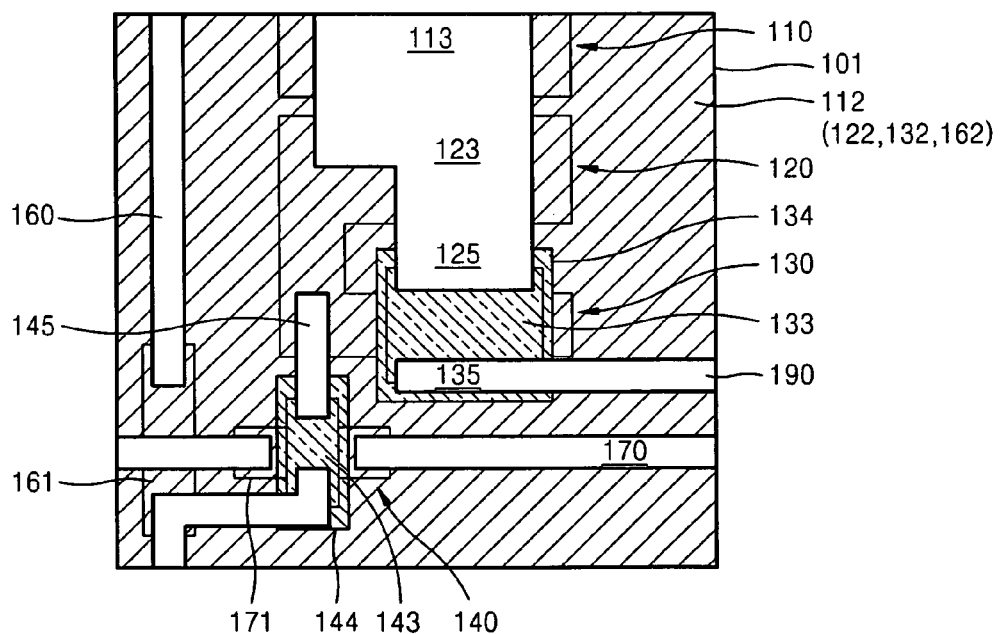

Next, as shown in FIG. 6D, the source-drain electrode layers 135, 145, and 123 respectively of the driving transistor 130, the switching transistor 140, and the capacitor 120, the pixel electrode layer 113 of the pixel unit 110, and the data line 160 and the scan line 170 may be patterned in the same layer by using the same material. The layers described above may be formed of, e.g., ITO, indium zinc oxide (IZO), or zinc oxide (ZnO).

The contact holes 111a, 121a, 131a, 133a, 143a, 161a, and 171a, may be filled with the layers described above, thereby forming appropriate electric connections. In particular, the gate electrode layer 111 and the pixel electrode layer 113 of the pixel unit 110 may be connected via the contact hole 111a. Further, the pixel unit 110 may be connected to the capacitor 120 and the driving transistor 130 via the contact hole 121a and one of the contact holes 133a adjacent to the contact hole 121a.

The active layer 133, the source-drain electrode layer 135, and the constant voltage line 190 of the driving transistor 130 may be connected other via the contact holes 133a. The driving transistor 130 may be connected to the capacitor 120 and the pixel unit 110 via the contact holes 111a and 121a.

The active layer 143 and the source-drain electrode layer 145 of the switching transistor 140 may be connected via the contact holes 143a. The switching transistor 140 may be connected to the driving transistor 130 and the capacitor 120 via the contact hole 131a.

Disconnected portions of the data line 160 may be electrically connected to each other by the bridge 161 via the contact holes 161a. The scan line 170 may pass above the bridge 161 at the intersection between the data line 160 and the scan line 170.

That is, the data line 160 and the scan line 170 may be formed in the same layer, however, the data line 160 and the scan line 170 may respectively cross under and over each other thereof via the bridge 161 at the intersection between the data line 160 and the scan line 170.

In addition, disconnected portions of the scan line 170 may be electrically connected to each other by the bridge 171 for the scan line 170 via the contact holes 171a, and the source-drain electrode layer 145 of the switching transistor 140, which diverges from the data line 160. Likewise, the scan line 170 and the source-drain electrode layer 145 may cross respectively under and over each other via the bridge 171 at an intersection between the scan line 170 and the source-drain electrode layer 145. Here, the source-drain electrode layer 145 of the switching transistor 140 crosses over the bridge 171, however, since the source-drain electrode layer 145 diverges from the data line 160, the data line 160 and the scan line 170 may cross each other at the bridge 171. Therefore, the data line 160 and the scan line 170, which are disposed in the same layer, do not interfere with each other by using the bridges 161 and 171.

A fourth mask may be used to pattern the source-drain electrode layers 123, 135, and 145, the pixel electrode layer 113 of the pixel unit 110, and the data line 160 and the scan line 170.

After that, the pixel definition layer 102 may be formed of an organic material or an inorganic material on the substrate 101, except for a region of the pixel unit 110 on which the organic light emitting device 200 is to be deposited, e.g., by using a fifth mask.

Next, the organic light emitting device 200 may be formed on the pixel unit 110, thus completing the configuration shown in FIG. 1. In FIG. 1, the counter electrode layer 220 of the organic light emitting device 200, which is formed over all of the pixel definition layer 102, as well as the pixel unit 110, are omitted for the convenience sake.

Through the processes described above, the organic light emitting display apparatus including the scan line 170 and the data line 160 formed in the same layer is fabricated, and accordingly, the number of mask processes may be reduced. In addition, since the scan line 170 and the data line 160 are formed in the same layer, thick wires may be formed, allowing easy realization of low resistance wires.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display apparatus, comprising:
   a pixel unit having an organic light emitting device thereon, the pixel unit including a pixel defining layer adjacent to the organic light emitting device;
   a thin film transistor (TFT) electrically connected to the pixel unit;
   a data line and a scan line electrically connected to the TFT and disposed crossing each other on a substrate, the data line and the scan line being in a first layer that is under the pixel defining layer; and
   a bridge on an intersection of the data line and the scan line, the bridge being in a second layer that is both under the pixel defining layer and the first layer, and one of the data line and the scan line crossing under the other of the data line and the scan line via the bridge at the intersection.

2. The organic light emitting display apparatus as claimed in claim 1, wherein the bridge includes a bridge for the data line and a bridge for the scan in the second layer, and the intersection further comprises:
   an insulating layer having first regions above the bridge for the data line and the bridge for the scan line, the data line and the scan line being above the insulating layer; and
   contact holes in the insulating layer include a first contact hole that extends through one of the first regions of the insulating layer and connects the data line to the bridge for the data line, and a second contact hole that extends through another of the first regions of the insulating layer and connects the scan line to the bridge for the scan line.

3. The organic light emitting display apparatus as claimed in claim 2, wherein the bridge for the data line is directly on the substrate and crosses the scan line with the insulating layer interposed therebetween, and the bridge for the scan line is directly on the substrate and crosses a source-drain electrode layer of the TFT diverging from the data line with the insulating layer interposed therebetween.

4. The organic light emitting display apparatus as claimed in claim 2, wherein the TFT includes:
- a gate electrode layer, on which the insulating layer is formed, in the second layer that has the bridge for the data line and the bridge for the scan line therein;
- an active layer on the insulating layer;
- an etch-stop insulating layer on the active layer; and
- a source-drain electrode on the etch-stop insulating layer in the first layer that has the data line and the scan line therein.

5. The organic light emitting display apparatus as claimed in claim 4, wherein the TFT includes:
- a switching transistor electrically connected to the data line and the scan line; and
- a driving transistor electrically connected to the data line and the pixel unit,
- wherein the bridge for the scan line corresponds to a gate electrode layer of the switching transistor.

6. The organic light emitting display apparatus as claimed in claim 2, wherein the pixel unit includes:
- a gate electrode layer, on which the insulating layer is formed, in the second layer that has the bridge for the data line and the bridge for the scan line therein, the gate electrode layer being on the substrate; and
- a pixel electrode layer on the insulating layer and in the first layer that has the data line and the scan line therein, the pixel electrode layer being connected to the gate electrode layer.

7. The organic light emitting display apparatus as claimed in claim 2, further comprising a capacitor electrically connected between the TFT and the pixel unit.

8. The organic light emitting display apparatus as claimed in claim 7, wherein the capacitor includes:
- a gate electrode layer, on which the insulating layer is formed, in the second layer that has the bridge for the data line and the bridge for the scan line therein, the gate electrode layer being on the substrate; and
- a source-drain electrode layer on the insulating layer and in the first layer that has the data line and the scan line therein.

9. A method of fabricating an organic light emitting display apparatus, the method comprising:
- forming a pixel unit having an organic light emitting device formed thereon, forming the pixel unit includes forming a pixel defining layer adjacent to the organic light emitting device;
- forming a thin film transistor (TFT) electrically connected to the pixel unit;
- forming a data line and a scan line electrically connected to the TFT and disposed crossing each other on a substrate, the data line and the scan line being formed in a first layer that is under the pixel defining layer; and
- forming a bridge on an intersection of the data line and the scan line, the bridge being formed in a second layer that is both under the pixel defining layer and the first layer, and one of the data line and the scan line being formed to cross under the other of the data line and the scan line via the bridge at the intersection.

10. The method as claimed in claim 9, wherein forming the bridge includes forming a bridge for the data line and a bridge for the scan line in the second layer.

11. The method as claimed in claim 10, further comprising:
- forming an insulating layer having first regions above the bridge for the data line and the bridge for the scan line, the data line and the scan line being above the insulating layer;
- forming contact holes includes forming a first contact hole that extends through one of the first regions of the insulating layer and connects the data line to the bridge for the data line, and a second contact hole that extends through another of the first regions of the insulating layer and connects the scan line to the bridge for the scan line; and
- stacking the data line and the scan line on the insulating layer such that the data line and the scan line cross over and under each other.

12. The method as claimed in claim 11, wherein the bridge for the data line is directly on the substrate and crosses the scan line with the insulating layer interposed therebetween, and the bridge for the scan line is directly on the substrate and crosses a source-drain electrode layer of the TFT diverging from the data line with the insulating layer interposed therebetween.

13. The method as claimed in claim 11, wherein forming the TFT includes:
- forming a gate electrode on the substrate and in the second layer that has the bridge for the data line and the bridge for the scan line are formed therein;
- forming the insulating layer on the gate electrode layer;
- forming an active layer on the insulating layer;
- forming an etch-stop insulating layer on the active layer; and
- forming a source-drain electrode layer on the etch-stop insulating layer in the first layer that has the data line and the scan line formed therein so as to be connected to the active layer.

14. The method as claimed in claim 13, wherein forming the TFT includes:
- forming a switching transistor electrically connected to the data line and the scan line; and
- forming a driving transistor electrically connected to the data line and the pixel unit,
- wherein the bridge for the scan line corresponds to a gate electrode layer of the switching transistor.

15. The method as claimed in claim 11, wherein forming the pixel unit includes:
- forming a gate electrode layer on the substrate to be the second layer that has the bridge for the data line and the bridge for the scan line formed therein;
- forming the insulating layer on the gate electrode layer; and
- forming a pixel electrode layer on the insulating layer and in the first layer that has the data line and the scan line formed therein so as to be connected to the gate electrode layer.

16. The method as claimed in claim 11, further comprising forming a capacitor that is electrically connected between the TFT and the pixel unit.

17. The method as claimed in claim 16, wherein forming the capacitor includes:
- forming a gate electrode layer on the substrate in the second layer that has the bridge for the data line and the bridge for the scan line formed therein;
- forming the insulating layer on the gate electrode layer; and
- forming a source-drain electrode layer on the insulating layer in the first layer that the data line and the scan line formed therein.

18. The organic light emitting display apparatus as claimed in claim 1, further comprising:
- an insulating layer having a first region that is above the bridge and a second region that is under the one of the data line and the scan line connected to the bridge, the first region of the insulating layer being under the other of the data line and the scan line; and a contact hole between the first region of the insulating layer and the second region, the one of the data line and the scan line being connected to the bridge via the contact hole.

19. The organic light emitting display apparatus as claimed in claim 1, wherein:
    the organic light emitting device includes an organic light emitting layer and the pixel defining layer is adjacent to the organic light emitting layer, and
    a portion of the first layer is between the pixel defining layer and the bridge.

20. The method as claimed in claim 9, further comprising:
    forming an insulating layer having a first region that is above the bridge and a second region that is under the one of the data line and the scan line connected to the bridge via, the first region of the insulating layer being under the other of the data line and the scan line; and
    forming a contact hole between the first region of the insulating layer and the second region such that the one of the data line and the scan line is connected to the bridge via the contact hole.

* * * * *